US010117020B2

(12) United States Patent
Mehta et al.

(10) Patent No.: US 10,117,020 B2
(45) Date of Patent: Oct. 30, 2018

(54) SYSTEMS AND METHODS FOR RESTORING MICROELECTROMECHANICAL SYSTEM TRANSDUCER OPERATION FOLLOWING PLOSIVE EVENT

(71) Applicant: Cirrus Logic International Semiconductor Ltd., Edinburgh (GB)

(72) Inventors: Jaimin Mehta, Austin, TX (US); James Thomas Deas, Edinburgh (GB); Stephen T. Hodapp, Austin, TX (US); Brian Parker Chesney, Bee Cave, TX (US)

(73) Assignee: Cirrus Logic, Inc., Austin, TX (US)

( * ) Notice: Subject to any disclaimer, the term of this patent is extended or adjusted under 35 U.S.C. 154(b) by 172 days.

(21) Appl. No.: 15/131,886

(22) Filed: Apr. 18, 2016

(65) Prior Publication Data

US 2017/0180853 A1 Jun. 22, 2017

Related U.S. Application Data

(60) Provisional application No. 62/269,328, filed on Dec. 18, 2015.

(51) Int. Cl.
*H03G 11/00* (2006.01)
*H04R 3/00* (2006.01)
(Continued)

(52) U.S. Cl.
CPC ........... *H04R 3/007* (2013.01); *H04R 29/004* (2013.01); *H04R 19/005* (2013.01); *H04R 2201/003* (2013.01)

(58) Field of Classification Search
CPC . H04R 3/007; H04R 29/004; H04R 2201/003
(Continued)

(56) References Cited

U.S. PATENT DOCUMENTS 4,088,838 A * 5/1978 Nakata .................... H04Q 1/46 379/283
5,165,017 A * 11/1992 Eddington ............ H03G 7/004 330/281
(Continued)

FOREIGN PATENT DOCUMENTS

EP 2645739 A1 10/2013

OTHER PUBLICATIONS

Paul White, "Pop Shields: Why You Need Them", May 2005.*
(Continued)

*Primary Examiner* — Katherine Faley
(74) *Attorney, Agent, or Firm* — Jackson Walker L.L.P.

(57) ABSTRACT

A system may include control circuitry for detecting a plosive event associated with a microphone transducer and in response to the plosive event, causing restoration of acoustic sense operation of the microphone transducer and a processing circuit associated with the microphone transducer. A system for configuring a filter having at least two frequency response configurations to achieve an effective frequency response configuration intermediate to the at least two frequency response configurations may include control circuitry for rapidly switching between the at least two frequency response configurations such that a weighted average frequency response of the filter corresponds to the effective frequency response configuration.

36 Claims, 3 Drawing Sheets

(51) Int. Cl.
*H04R 29/00* (2006.01)
*H04R 19/00* (2006.01)

(58) Field of Classification Search
USPC .......................................... 381/55, 174, 175
See application file for complete search history.

(56) References Cited

U.S. PATENT DOCUMENTS

| | | | | |
|---|---|---|---|---|
| 2004/0044512 | A1 | 3/2004 | Cross | |
| 2004/0209591 | A1 | 10/2004 | Martin | |
| 2007/0003078 | A1* | 1/2007 | Escott | H03G 7/007 381/107 |
| 2009/0279719 | A1 | 11/2009 | Lesso | |
| 2010/0310096 | A1 | 12/2010 | Josefsson et al. | |
| 2011/0142261 | A1 | 6/2011 | Josefsson | |
| 2012/0076339 | A1 | 3/2012 | Buck et al. | |
| 2013/0051582 | A1 | 2/2013 | Kropfitsch et al. | |
| 2013/0064397 | A1 | 3/2013 | Duenser | |
| 2016/0087596 | A1* | 3/2016 | Yurrtas | H04R 1/04 381/111 |

OTHER PUBLICATIONS

Chi et al., “Measuring oral and nasal airflow in production of Chinese plosive”, Sep. 2015.*
Hess, “Animating with Blender: How to Create Short Animations from Start to Finish”, 2009, p. 121.*
Search Report under Section 17, Application No. GB1608883.3, dated Jul. 5, 2016.
International Search Report and Written Opinion of the International Searching Authority, International Application No. PCT/US2016/066910, dated Mar. 30, 2017.
International Search Report and Written Opinion of the International Searching Authority, International Application No. PCT/US2016/067117, dated May 22, 2017.

* cited by examiner

SYSTEMS AND METHODS FOR RESTORING MICROELECTROMECHANICAL SYSTEM TRANSDUCER OPERATION FOLLOWING PLOSIVE EVENT

RELATED APPLICATIONS

The present disclosure claims priority to U.S. Provisional Patent Application Ser. No. 62/269,328, filed Dec. 18, 2015, which is incorporated by reference herein in its entirety.

FIELD OF DISCLOSURE

The present disclosure relates in general to audio systems, and more particularly, to restoring a microelectromechanical system (MEMS) based transducer operation following a plosive event and configuring a filter having at least two frequency response configurations to achieve an effective frequency response configuration intermediate to the at least two frequency response configurations.

BACKGROUND

Microphones are ubiquitous on many devices used by individuals, including computers, tablets, smart phones, and many other consumer devices. Generally speaking, a microphone is an electroacoustic transducer that produces an electrical signal in response to deflection of a portion (e.g., a membrane or other structure) of a microphone caused by sound incident upon the microphone. For example, a microphone may be implemented as a MEMS transducer. A MEMS transducer may include a diaphragm or membrane having an electrical capacitance, such that a change in acoustic pressure applied to the MEMS transducer causes a deflection or other movement of the membrane, and thus causes a change in the electrical capacitance. Such change may be sensed by a sensing circuit and processed.

Sensing of a MEMS transducer may rely on a constant charge present on the electrical capacitance of the MEMS transducer. Thus, a large bias voltage, typically higher than a breakdown voltage of the MEMS transducer, may be used to bias the MEMS transducer. Therefore, it is often necessary to protect a MEMS transducer to prevent too large of a voltage appearing on the electrical capacitance of the MEMS transducer. Such protection is often achieved with a voltage clamp, which may be implemented with diodes. However, when such a voltage clamp activates during a very large input (e.g., very high acoustic pressure), charge may be added or removed from the electrical capacitance of the MEMS transducer. When the large input is removed, the charge on the electrical capacitance must recover from the point at which the voltage clamps to its original charge. This voltage recovery can cause a large voltage offset of the microphone, which may cause audio artifacts (e.g., clipping, distortion) that last several seconds until the charge on the electrical capacitance returns to its original level. Such a large input event may be referred to as a “plosive event.” A plosive event may be defined as any event in which the MEMS transducer is exposed to an input (e.g., very high acoustic pressure) greater than a peak input, such that undesirable charge is added or removed from the electrical capacitance of the MEMS transducer. A plosive event may include a “pull-in event,” in which capacitive plates of the electrical capacitance of the MEMS transducer electrically short together (e.g., due to very high acoustic pressure). Such plosive events may cause high-impedance nodes of sensing circuitry coupled to the MEMS transducer to lose charge, leading to reduced sensitivity of the MEMS transducer, and in some cases, loss of functionality due to signal clipping or other audio artifacts.

Traditional analog MEMS transducers typically rely on diodes to prevent overload and to provide a low-impedance path to replenish charge in a MEMS transducer responsive to a plosive event. However, such approach may be disadvantageous as it may require design tradeoffs. If too few diodes are used, the diode conduction path may turn on at expected large audio inputs, causing distortion of audio signals. On the other hand, if too many diodes are used, then they may not return high-impedance nodes of a sensing circuit to a value close enough to its direct current level to settle back to normal operation in a reasonable amount of time.

SUMMARY

In accordance with the teachings of the present disclosure, certain disadvantages and problems associated with restoring operation to a MEMS transducer following a plosive event may be reduced or eliminated.

In accordance with embodiments of the present disclosure, a system may include control circuitry for detecting a plosive event associated with a microphone transducer and in response to the plosive event, causing restoration of acoustic sense operation of the microphone transducer and a processing circuit associated with the microphone transducer.

In accordance with these and other embodiments of the present disclosure, a method may include detecting a plosive event associated with a microphone transducer and, in response to the plosive event, causing restoration of acoustic sense operation of the microphone transducer and a processing circuit associated with the microphone transducer.

In accordance with these and other embodiments of the present disclosure, a method of configuring a filter having at least two frequency response configurations to achieve an effective frequency response configuration intermediate to the at least two frequency response configurations may include rapidly switching between the at least two frequency response configurations such that a weighted average frequency response of the filter corresponds to the effective frequency response configuration.

In accordance with these and other embodiments of the present disclosure, a system for configuring a filter having at least two frequency response configurations to achieve an effective frequency response configuration intermediate to the at least two frequency response configurations may include control circuitry for rapidly switching between the at least two frequency response configurations such that a weighted average frequency response of the filter corresponds to the effective frequency response configuration.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are explanatory examples and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

A plosive response system may detect plosive events and take appropriate corrective actions to minimize impact of plosive events on performance of a microphone transducer. A large number of diodes (not shown in the associated figures for purposes of clarity of exposition) may be used to protect a microphone transducer, and additional recovery of the microphone transducer may be accomplished via the systems and methods described below.

Figure 1:
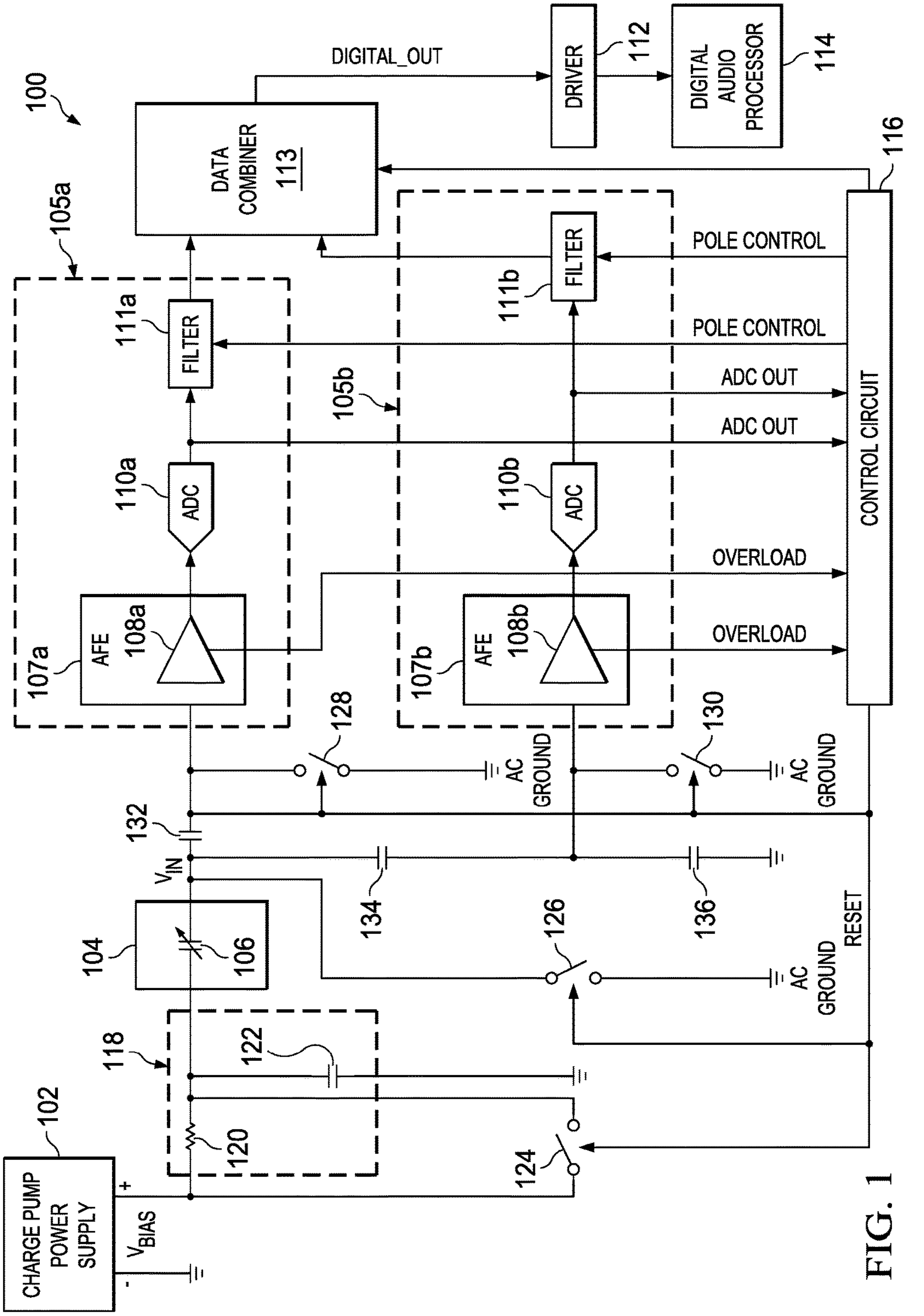
FIG. 1 illustrates a block diagram of selected components of an example audio system, in accordance with embodiments of the present disclosure.

FIG. 1 illustrates a block diagram of selected components of an example audio system 100, in accordance with embodiments of the present disclosure. As shown in FIG. 1, audio system 100 may include an analog signal path portion comprising a charge pump power supply 102, a charge-pump filter 118, a microphone transducer 104, two or more processing paths 105*a* and 105*b* (which may be referred to herein individually as a processing path 105 and collectively as processing paths 105), a data combiner 113, a driver 112, a digital audio processor 114, a control circuit 116, and one or more reset switches 124, 126, 128, and 130.

Charge pump power supply 102 may comprise any suitable system, device, or apparatus configured to supply microphone transducer 104 with a direct current (DC) bias voltage $V_{BIAS}$, such that microphone transducer 104 may generate an electrical audio signal. Charge pump filter 118 may comprise any suitable system, device, or apparatus configured to low-pass filter DC bias voltage $V_{BIAS}$ in order to remove noise and other high-frequency components present in DC bias voltage $V_{BIAS}$. For example, as shown in FIG. 1, charge pump filter 118 may comprise an resistor-capacitor (RC) filter comprising a resistive element 120 (e.g., a resistor, a diode having a significant resistance) and a capacitive element 122. DC bias voltage $V_{BIAS}$ as filtered by charge pump filter 118 may be supplied to a terminal of microphone transducer 104 in order to bias microphone transducer 104.

Microphone transducer 104 may comprise any suitable system, device, or apparatus configured to convert sound incident at microphone transducer 104 to an electrical signal, wherein such sound is converted to an electrical analog input signal $v_{IN}$ using a diaphragm or membrane having an electrical capacitance (modeled as variable capacitor 106 in FIG. 1) that varies based on sonic vibrations received at the diaphragm or membrane. Microphone transducer 104 may include an electrostatic microphone, a condenser microphone, an electret microphone, a microelectromechanical systems (MEMS) microphone, or any other suitable capacitive microphone.

As shown in FIG. 1, processing paths 105 may receive analog input signal $v_{IN}$ (as filtered by DC blocking capacitor 132 or as divided by a capacitor divider implemented by capacitors 134 and 136) and process analog input signal $v_{IN}$ such that each processing path 105 generates a corresponding intermediate digital output signal based on analog input signal $v_{IN}$. Each processing path 105 may include a respective analog front end (AFE) 107 (e.g., AFE 107*a*, AFE 107*b*), a respective analog-to-digital converter (ADC) 110 (e.g., ADC 110*a*, ADC 110*b*), and a respective filter 111 (e.g., filter 111*a*, filter 111*b*).

An AFE 107 may receive analog input signal $v_{IN}$ via one or more input lines which may allow for receipt of a single-ended signal, differential signal, or any other suitable analog signal format and may comprise any suitable system, device, or apparatus configured to condition analog input signal $v_{IN}$ for processing by ADC 110. As shown in FIG. 1, an AFE 107 may comprise a pre-amplifier 108 (e.g., pre-amplifier 108*a*, pre-amplifier 108*b*) having an input to receive analog input signal $v_{IN}$ output from microphone transducer 104 and may comprise any suitable system, device, or apparatus configured to condition analog input signal $v_{IN}$ for processing by ADC 110.

An ADC 110 may comprise any suitable system, device, or apparatus configured to convert an analog signal received at its input to a digital signal representative of analog input signal $v_{IN}$. ADC 110 may itself include one or more components (e.g., delta-sigma modulator, decimator, etc.) for carrying out the functionality of ADC 110.

Each filter 111 (e.g., filter 111*a*, filter 111*b*) may filter a digital signal generated by its associated ADC 110, to remove undesired frequency components present in the digital signal. In some embodiments, each filter 111 may comprise a high-pass filter to filter out any direct-current offsets present in the digital signal.

Although not shown in FIG. 1, one or both of processing paths 105 may include one or more elements for latency matching, phase matching, or otherwise balancing a difference in propagation time of signals through processing paths 105.

In some embodiments, a magnitude of a gain of amplifier 108*a* may be substantially larger than (e.g., significantly more than manufacturing tolerances, one or more orders of magnitude) a magnitude of a gain of amplifier 108*b*. In addition, in these and other embodiments, a magnitude of a gain of ADC 110*b* (or other digital element in processing path 105*b*) may be substantially larger than (e.g., significantly more than manufacturing tolerances, one or more orders of magnitude) a magnitude of a gain of ADC 110*a* (or other digital element in processing path 105*a*). Consequently, in such embodiments, a first path gain equal to the product of the magnitude of the gain of amplifier 108*a* and the magnitude of the gain of ADC 110*a* (or other digital gain element within processing path 105*a*) may be substantially equal (e.g., within manufacturing tolerances) to a second path gain equal to the product of the magnitude of the gain of amplifier 108*b* and the magnitude of the gain of ADC 110*b* (or other digital gain element within processing path 105*b*). Accordingly, each processing path 105 may be adapted to process a particular amplitude of analog input signal $v_{IN}$. For example, AFE 107*a* may be suited to process lower signal amplitudes, as its larger gain may permit effective processing of smaller signals, but characteristics of AFE 107*a* may not be amenable to higher amplitudes. On the other hand, AFE 107*b* may be suited to process higher signal amplitudes, as its lower gain will reduce the likelihood of signal clipping, and may provide for greater dynamic range for analog input signal $v_{IN}$ as compared to traditional single-path approaches.

A data combiner 113 may receive a respective digital signal from each of processing paths 105 and may select one of the digital signals as digital output signal DIGITAL_OUT based on a control signal generated by and communicated from control circuit 116. Thus, depending on an amplitude of analog input signal $v_{IN}$, control circuit 116 may select one of the processing paths 105 as an active path for generating digital output signal DIGITAL_OUT. In some embodiments, data combiner 113 may also be configured to generate a weighted average of its inputs, such that when changing between selection of its inputs, it blends or cross-fades between processing paths 105, to reduce or eliminate audio artifacts that may occur due to switching between processing paths 105.

Driver 112 may receive digital signal output by ADC 110 and may comprise any suitable system, device, or apparatus configured to condition such digital signal (e.g., encoding into Audio Engineering Society/European Broadcasting Union (AES/EBU), Sony/Philips Digital Interface Format (S/PDIF), or other suitable audio interface standards), in the process generating a digitized microphone signal for transmission over a bus to digital audio processor 114. For example, in some embodiments driver 112 may comprise a single-bit output modulator to generate pulse-density modulated data.

Digital audio processor 114 may comprise any suitable system, device, or apparatus configured to process the digitized microphone signal for use in a digital audio system. For example, digital audio processor 114 may comprise a microprocessor, microcontroller, digital signal processor (DSP), application specific integrated circuit (ASIC), or any other device configured to interpret and/or execute program instructions and/or process data, such as the digitized microphone signal output by driver 112.

Control circuit 116 may comprise any suitable system, device, or apparatus for detecting a plosive event associated with microphone transducer 104 and in response to the plosive event, causing restoration of acoustic sense operation of the microphone transducer 104 and the processing circuit (e.g., components of system 100 other than microphone transducer 104) associated with microphone transducer 104. For example, as described in greater detail below, control circuit 116 may, based on monitoring one or more characteristics of system 100, determine whether one or more indications of a plosive event has occurred, determine from the one or more indications whether a plosive event has occurred, and in response to determining that a plosive event has occurred, enable one or more of reset switches 124, 126, 128, and 130 to reset electrical characteristics of electrical nodes coupled to such switches, and/or control a pole of one or both filters 111 in order to cause restoration of acoustic sense operation of microphone transducer 104 and the processing circuit associated with microphone transducer 104.

Figure 2:
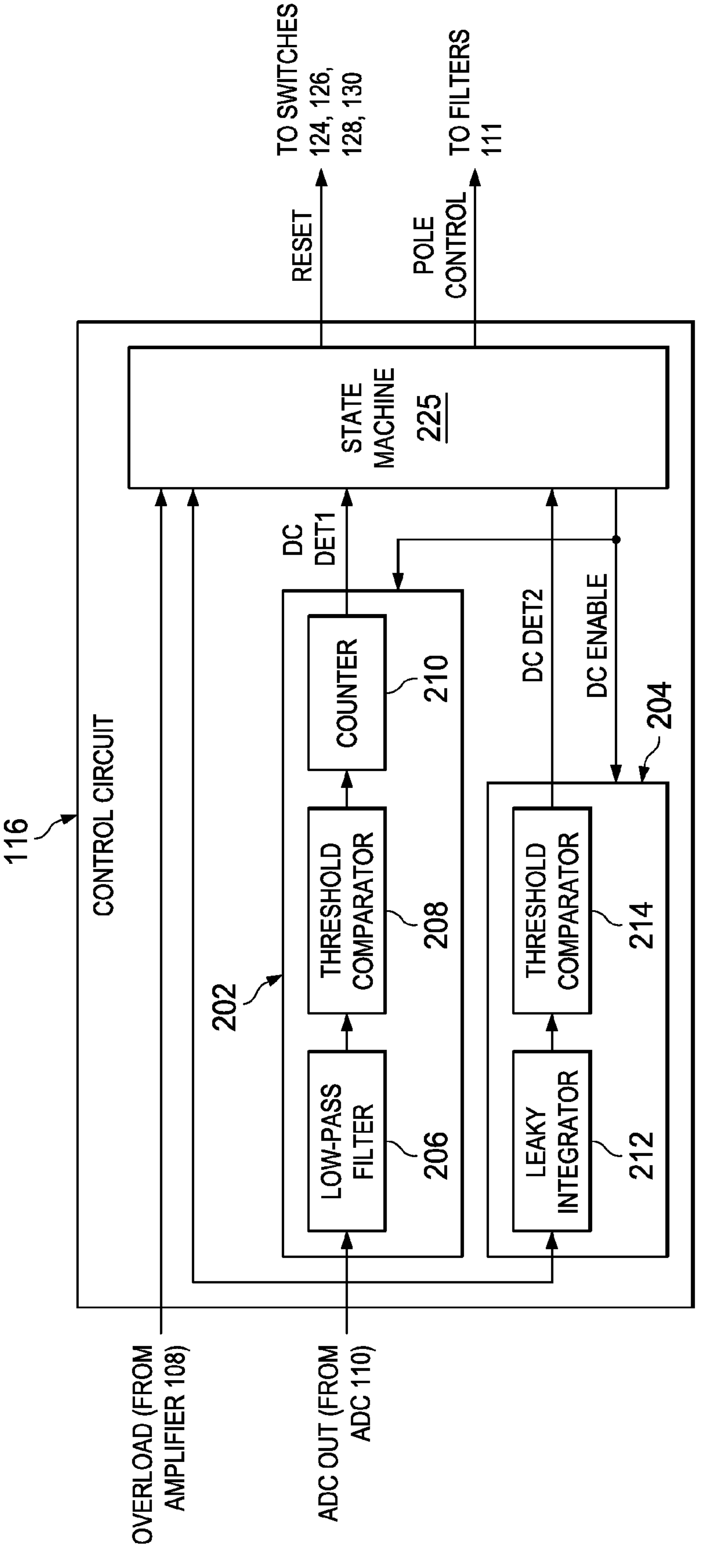
FIG. 2 illustrates a block diagram of selected components of an example control circuit, in accordance with embodiments of the present disclosure.

FIG. 2 illustrates a block diagram of selected components of an example control circuit 116, in accordance with embodiments of the present disclosure. As shown in FIG. 2, control circuit 116 may include a state machine 225 configured to receive one or more indications of a plosive event, determine from the one or more indications whether a plosive event has occurred, and in response to determining a plosive event has occurred, enable one or more of reset switches 124, 126, 128, and 130 to reset electrical characteristics of electrical nodes coupled to such switches, and/or control a pole of one or both filters 111 in order to cause restoration of acoustic sense operation of microphone transducer 104 and the processing circuit associated with microphone transducer 104. For example, one indication of a plosive event may be detection of saturation of an AFE 107, as indicated by one or more of the "OVERLOAD" signals communicated from amplifiers 108 to control circuit 116. In some embodiments, state machine 225 may determine that a plosive event has occurred if such saturation has lasted longer than a threshold period of time (e.g., 100 milliseconds). As another example, another indication of a plosive event may be detection of clipping in the digital domain of the processing circuit, such as may be indicated by analyzing the magnitude of output signals "ADC_OUT" of one or more ADCs 110. In some embodiments, state machine 225 may determine that a plosive event has occurred if such clipping has lasted longer than a threshold period of time (e.g., 100 milliseconds).

As a further example, another indication of a plosive event may be detection of presence of a DC component of a signal in a signal path of the processing circuit. Specific examples of detecting DC components of a signal in a signal path of the processing circuit may include threshold-based time detection implemented by DC detector 202 and leaky-integrator based DC detection implemented by DC detector 204.

In threshold-based time detection of DC components, DC detector 202 may detect presence of a DC offset responsive to a magnitude of a signal (e.g., signal ADC_OUT output by an ADC 110) continuously exceeding a threshold magnitude (e.g., 0.1 relative to a full scale magnitude) for a threshold duration of time (e.g., 25 milliseconds). In operation, the signal (e.g., signal ADC_OUT output by an ADC 110) may be low-pass filtered by low-pass filter 206 to remove any delta-sigma or other noise of ADC 110. Such filtered output may roughly correspond to the output of the amplifier 108 that generates an input signal to ADC 110. Threshold comparator 208 may determine if a magnitude (e.g., absolute value) of such filtered signal exceeds the threshold magnitude. Threshold comparator 208 may enable a counter 210 that outputs to state machine 225 an indication that a DC offset is present in the signal if the filtered signal exceeds the threshold magnitude for the threshold duration of time.

In leaky-integrator based DC detection of DC components, DC detector 204 may detect presence of a DC offset in a signal responsive to a determination that a filtered version of the signal filtered to remove audible frequencies from the signal has a magnitude that exceeds a threshold magnitude (e.g., 0.65 relative to a full-scale magnitude). In operation, the signal (e.g., signal ADC_OUT output by an ADC 110) may be received by leaky integrator 212 which has a pole set at a frequency (e.g., 7.3 Hz) to reject substantially all of the audible frequencies from the signal. Threshold comparator 214 may determine if a magnitude (e.g., absolute value) of such filtered signal exceeds the threshold magnitude, and if so, may output to state machine 225 an indication that a DC offset is present in the signal.

In some embodiments, DC component detection may be enabled only in response to another indication of a plosive event, as indicated by the signal DC_ENABLE communicated by state machine 225 to DC detector 202 and DC detector 204. For example, state machine 225 may enable DC component detection responsive to saturation of an AFE 107, as indicated by one or more of the "OVERLOAD" signals communicated from amplifiers 108 to control circuit 116. As a specific example, in some embodiments, DC component detection may be enabled in response to detection of saturation for any period of time.

If, from the one or more indications of a plosive event, control circuit 116 determines a plosive event has occurred, control circuit 116 may cause restoration of acoustic sense operation of microphone transducer 104 and the processing circuit associated with microphone transducer 104 by taking one or more actions. For example, in some embodiments, control circuit 116 may cause restoration of acoustic sense operation of microphone transducer 104 and/or its associated processing circuit by modifying a pole of charge-pump filter 118. As a specific example, in some of such embodiments, control circuit 116 may modify a pole of charge-pump filter 118 by activating (e.g., closing, turning on) reset switch 124, to effectively short the terminals of resistive element 120 of charge-pump filter 118 together. For large plosive events, capacitive element 122 of charge-pump filter 118 may have significant charge added or removed. Shorting of the terminals of resistive element 120 of charge-pump filter 118 together in response to a plosive event may speed up recovery of both capacitive element 122 and capacitor 106 of microphone transducer 104.

In these and other embodiments, control circuit 116 may cause restoration of acoustic sense operation of microphone transducer 104 and/or its associated processing circuit by forcing one or more electrical nodes of the processing circuit used for sensing to their common-mode voltages. As specific examples, in some of such embodiments, control circuit 116 may: (a) force the output node of microphone transducer 104 to its common-mode voltage by activating (e.g., closing, turning on) reset switch 126 to short the output node of microphone transducer 104 to alternating current (AC) ground; (b) force the input node of AFE 107*a* to its common-mode voltage by activating (e.g., closing, turning on) reset switch 128 to short the input node of AFE 107*a* to AC ground; and/or (c) force the input node of AFE 107*b* to its common-mode voltage by activating (e.g., closing, turning on) reset switch 130 to short the input node of AFE 107*b* to AC ground.

In these and other embodiments, control circuit 116 may cause restoration of acoustic sense operation of microphone transducer 104 and/or its associated processing circuit by modifying a pole frequency of one or more of filters 111 from an original pole frequency to increase a response of the one or more filters 111 to voltage ringing in one or more of AFEs 107, and then transitioning the pole frequency back to the original pole frequency in a plurality of steps in order to render the transition substantially inaudible. Such modification of pole frequency of the one or more filters 111 may be desirable due to activation of reset switches 124, 126, 128, and 130. Once reset switches 124, 126, 128, and 130 and inputs to AFEs 107 are shorted to ground, processing paths 105 have no analog input signal to process and thus, reset switches 124, 126, 128, and 130 must be deactivated (e.g., opened, turned off) after a fixed period of time that is long enough to allow nodes coupled to reset switches 124, 126, 128, and 130 to settle. This manner of switch operation may cause charge on microphone transducer 104 to be "incorrect" in the sense that microphone transducer 104 may not be producing an analog input signal $v_{IN}$ of zero when switches 124, 126, 128, and 130 are deactivated. In many cases, such difference may be small in comparison to the maximum allowed magnitude for analog input signal $v_{IN}$, and thus, may settle out over time. Nonetheless, some voltage ringing may be present during such time, and modification of the poles of filters 111 may remove any such offset caused by ringing.

Figure 3:
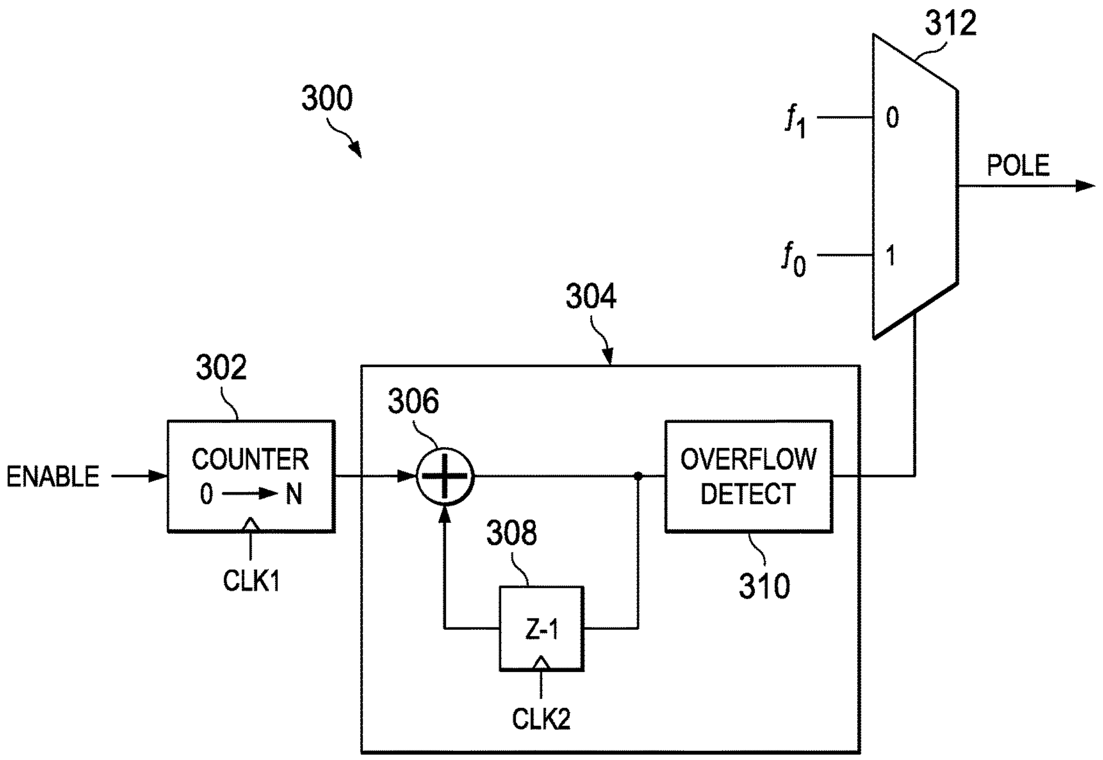
FIG. 3 illustrates a block diagram of selected components of an example dithering system for modifying pole frequency of a filter from an original frequency and transitioning the pole frequency of the filter back to the original frequency, in accordance with embodiments of the present disclosure.

Any suitable system, device, or apparatus may be used to modify the pole frequency of one or more of filters 111 from its original pole frequency and then transitioning its pole frequency back to the original pole frequency in a plurality of steps. FIG. 3 illustrates a block diagram of selected components of an example dithering system 300 for modifying pole frequency of a filter from an original frequency and transitioning the pole frequency of the filter back to the original frequency. In some embodiments, dithering system 300 may be integral to state machine 225. As shown in FIG. 3, dithering system 300 may include a digital counter 302 configured to count between 0 and N, a delta-sigma modulator 304, and a multiplexer 312.

The values output by counter 302 may represent steps of intermediate frequencies between an original frequency $f_0$ and another frequency $f_1$. In the case of a high-pass filter, frequency $f_1$ may be greater than original frequency $f_0$. For example, in some embodiments, original frequency $f_0$ may be 2 Hz and frequency $f_1$ may be 14 Hz, which may be suitable for removing DC components by a high-pass filter (e.g., filter 111) as both frequencies are below the audible range of frequencies. In operation, in response to a plosive event, state machine 225 may assert the ENABLE signal to counter 302, which may reset counter 302 to zero. Counter 302 may increment in accordance with a clock signal CLK1. Because counter 302 counts from 0 to N, the output of counter 302 may represent N+1 frequencies between original frequency $f_0$ and frequency $f_1$.

Delta-sigma modulator 304 may receive the output of counter 302 and generate a one-bit overflow signal having a duty cycle proportional to the output of counter 302. As shown in FIG. 3, delta-sigma modulator 304 may include a summer 306 for combining the output of counter 302 with a feedback signal which is a time-based integral of the output of counter 302 as delayed by delay element 308 clocked with a clock signal CLK2. An overflow detector 310 may detect each time the integrated counter signal output by summer 306 overflows, and output an overflow signal indicating such overflow. Clock signal CLK2 may be at a substantially higher frequency than CLK1, such that for each value of counter 302, delta-sigma modulator 304 may overflow multiple times, such that the output of overflow detector 310 is a pulse-width modulation-like signal having a duty cycle proportional to the output of counter 302. Although FIG. 3 depicts a first-order delta-sigma modulator 304, in some embodiments, dithering system 300 may employ a second-order or higher delta-sigma modulator.

The output of the overflow detector 310 may serve as a control signal to multiplexer 312, which passes one of original frequency $f_0$ and frequency $f_1$ based on the control signal. Accordingly, for each value of counter 302, the output of multiplexer 312 rapidly switches between two frequency response configurations (e.g., original frequency $f_0$ and frequency $f_1$) thus providing a time-varying pole frequency having a weighted average frequency based on the duty cycle of the switching signal output by delta-sigma modulator 304 (and thus, based on the value output by counter 302) which serves as an effective frequency response configuration for such value of counter 302 which is intermediate to the two frequency response configurations.

Accordingly, dithering system 300 enables a high-pass filter (e.g., filter 111) to transition in a plurality of steps (e.g., 0 to N) between a first effective frequency response approximately equal to one of the two frequency response configurations (e.g., frequency $f_1$) and a second effective frequency response approximately equal to another of the at least two frequency response configurations (e.g., frequency $f_0$) by sequentially applying at least one effective frequency response configuration intermediate to the two frequency response configurations. Such transitioning in steps between the first effective frequency response and the second effective frequency response, rather than directly between the first effective frequency response and the second effective frequency response, may minimize audio artifacts.

Although the foregoing discussion contemplates application of dithering system 300 to enable recovery from plosive events of microphone transducer 104, dithering system 300 and systems substantially similar to dithering system 300 are not limited in application to plosive event recovery and may also be used in applications other than recovery from plosive events of a microphone transducer. In addition, although the foregoing discussion contemplates application of dithering system 300 to modify a pole of a high-pass filter, dithering system 300 and systems substantially similar to dithering system 300 are not limited in application to modifying poles of high-pass filters and may also be used to modify poles of other filters, including without limitation low-pass filters, band-pass filters, and notch filters.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

What is claimed is:

1. A system comprising: control circuitry for detecting a plosive event associated with a microphone transducer and in response to the plosive event, causing restoration of acoustic sense operation of the microphone transducer and a processing circuit associated with the microphone transducer by modifying a pole of a charge-pump filter at an output of a charge pump for generating a bias voltage for the microphone transducer.

2. The system of claim 1, further comprising the microphone transducer coupled to the control circuitry.

3. The system of claim 1, wherein the control circuitry detects the plosive event by detecting saturation of an analog front-end circuit of the processing circuit.

4. The system of claim 1, wherein the control circuitry detects the plosive event by detecting signal clipping in a digital domain of the processing circuit.

5. The system of claim 1, wherein the control circuitry detects the plosive event by detecting presence of a direct current component of a signal in a signal path of the processing circuit.

6. The system of claim 5, wherein the control circuitry detects presence of a direct current component offset responsive to a magnitude of the signal continuously exceeding a threshold magnitude for a threshold duration of time in order to detect the presence of the direct current component of the signal in the signal path of the processing circuit.

7. The system of claim 5, wherein the control circuitry detects the presence of the direct current component by low-pass filtering the signal to generate a filtered signal and comparing a magnitude of the filtered signal to a threshold magnitude.

8. The system of claim 1, wherein the control circuitry causes restoration of acoustic sense operation of the microphone transducer and the processing circuit by forcing one or more electrical nodes of the processing circuit used for sensing to their common-mode voltages.

9. The system of claim 1, wherein the control circuitry causes restoration of acoustic sense operation of the microphone transducer and the processing circuit by:

modifying a pole frequency of a high-pass filter of the processing circuit from an original pole frequency to increase a response of the high-pass filter to ringing of an analog front-end circuit of the processing circuit; and transitioning the pole frequency back to the original pole frequency in a plurality of steps in order to render the transition substantially inaudible.

10. The system of claim 1, wherein the microphone transducer comprises a microelectromechanical system (MEMS) transducer.

11. A method comprising:

detecting a plosive event associated with a microphone transducer; and in response to the plosive event, causing restoration of acoustic sense operation of the microphone transducer and a processing circuit associated with the microphone transducer by modifying a pole of a charge-pump filter at an output of a charge pump for generating a bias voltage for the microphone transducer.

12. The method of claim 11, wherein detecting the plosive event comprises detecting saturation of an analog front-end circuit of the processing circuit.

13. The method of claim 11, wherein detecting the plosive event comprises detecting signal clipping in a digital domain of the processing circuit.

14. The method of claim 11, wherein detecting the plosive event comprises detecting presence of a direct current component of a signal in a signal path of the processing circuit.

15. The method of claim 14, wherein detecting presence of the direct current component comprises detecting presence of an offset of the direct current component responsive to a magnitude of the signal continuously exceeding a threshold magnitude for a threshold duration of time.

16. The method of claim 14, wherein detecting presence of the direct current component comprises low-pass filtering the signal to generate a filtered signal and comparing a magnitude of the filtered signal to a threshold magnitude.

17. The method of claim 11, wherein causing restoration of acoustic sense operation of the microphone transducer and the processing circuit comprises forcing one or more electrical nodes of the processing circuit used for sensing to their common-mode voltages.

18. The method of claim 11, wherein causing restoration of acoustic sense operation of the microphone transducer and the processing circuit comprises:

modifying a pole frequency of a high-pass filter of the processing circuit from an original pole frequency to increase a response of the high-pass filter to ringing of an analog front-end circuit of the processing circuit; and transitioning the pole frequency back to the original pole frequency in a plurality of steps in order to render the transition substantially inaudible.

19. The method of claim 11, wherein the microphone transducer comprises a microelectromechanical system (MEMS) transducer.

20. A system comprising:

control circuitry for detecting a plosive event associated with a microphone transducer and in response to the plosive event, causing restoration of acoustic sense operation of the microphone transducer and a processing circuit associated with the microphone transducer by:

modifying a pole frequency of a high-pass filter of the processing circuit from an original pole frequency to increase a response of the high-pass filter to ringing of an analog front-end circuit of the processing circuit; and transitioning the pole frequency back to the original pole frequency in a plurality of steps in order to render the transition substantially inaudible.

21. The system of claim 20, further comprising the microphone transducer coupled to the control circuitry.

22. The system of claim 20, wherein the control circuitry detects the plosive event by detecting saturation of an analog front-end circuit of the processing circuit.

23. The system of claim 20, wherein the control circuitry detects the plosive event by detecting signal clipping in a digital domain of the processing circuit.

24. The system of claim 20, wherein the control circuitry detects the plosive event by detecting presence of a direct current component of a signal in a signal path of the processing circuit.

25. The system of claim 24, wherein the control circuitry detects presence of a direct current component offset responsive to a magnitude of the signal continuously exceeding a threshold magnitude for a threshold duration of time in order to detect the presence of the direct current component of the signal in the signal path of the processing circuit.

26. The system of claim 24, wherein the control circuitry detects the presence of the direct current component by low-pass filtering the signal to generate a filtered signal and comparing a magnitude of the filtered signal to a threshold magnitude.

27. The system of claim 20, wherein the control circuitry causes restoration of acoustic sense operation of the microphone transducer and the processing circuit by forcing one or more electrical nodes of the processing circuit used for sensing to their common-mode voltages.

28. The system of claim 20, wherein the microphone transducer comprises a microelectromechanical system (MEMS) transducer.

29. A method comprising:

detecting a plosive event associated with a microphone transducer; and in response to the plosive event, causing restoration of acoustic sense operation of the microphone transducer and a processing circuit associated with the microphone transducer by:

modifying a pole frequency of a high-pass filter of the processing circuit from an original pole frequency to increase a response of the high-pass filter to ringing of an analog front-end circuit of the processing circuit; and transitioning the pole frequency back to the original pole frequency in a plurality of steps in order to render the transition substantially inaudible.

30. The method of claim 29, wherein detecting the plosive event comprises detecting saturation of the analog front-end circuit of the processing circuit.

31. The method of claim 29, wherein detecting the plosive event comprises detecting signal clipping in a digital domain of the processing circuit.

32. The method of claim 29, wherein detecting the plosive event comprises detecting presence of a direct current component of a signal in a signal path of the processing circuit.

33. The method of claim 32, wherein detecting presence of the direct current component comprises detecting presence of a direct current component offset responsive to a magnitude of the signal continuously exceeding a threshold magnitude for a threshold duration of time.

34. The method of claim 32, wherein detecting presence of the direct current component comprises low-pass filtering the signal to generate a filtered signal and comparing a magnitude of the filtered signal to a threshold magnitude.

35. The method of claim 29, wherein causing restoration of acoustic sense operation of the microphone transducer and the processing circuit comprises forcing one or more electrical nodes of the processing circuit used for sensing to their common-mode voltages.

36. The method of claim 29, wherein the microphone transducer comprises a microelectromechanical system (MEMS) transducer.

* * * * *